(12) United States Patent
Lin et al.

(10) Patent No.: US 12,535,363 B2
(45) Date of Patent: Jan. 27, 2026

(54) RADICAL SENSOR SUBSTRATE

(71) Applicant: Applied Materials, Inc., Santa Clara, CA (US)

(72) Inventors: Chuang-Chia Lin, San Ramon, CA (US); Martin Hilkene, Gilroy, CA (US); Amir Bayati, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 719 days.

(21) Appl. No.: 17/876,392

(22) Filed: Jul. 28, 2022

(65) Prior Publication Data
US 2024/0035896 A1    Feb. 1, 2024

(51) Int. Cl.
*G01K 7/02* (2021.01)
*G01K 11/26* (2006.01)
*H01J 37/32* (2006.01)
*H01L 21/67* (2006.01)

(52) U.S. Cl.
CPC ............ *G01K 7/021* (2013.01); *G01K 11/265* (2013.01); *H01J 37/32917* (2013.01); *H01L 21/67248* (2013.01)

(58) Field of Classification Search
CPC ...... G01K 7/021; G01K 11/265; G01K 7/028; G01K 7/24; H01J 37/32917; H01L 21/67248
See application file for complete search history.

(56) References Cited

U.S. PATENT DOCUMENTS

| 5,707,148 | A | 1/1998 | Visser et al. | |
|---|---|---|---|---|
| 5,969,639 | A * | 10/1999 | Lauf | H01Q 3/26 342/368 |
| 10,460,966 | B2 * | 10/2019 | Sun | H01L 21/67248 |
| 10,861,682 | B2 * | 12/2020 | O'Banion | H01L 21/67109 |
| 11,735,447 | B2 * | 8/2023 | Santhanam | H01L 21/67276 700/109 |
| 2004/0026268 | A1 * | 2/2004 | Maki | G01N 27/407 204/426 |
| 2015/0101395 | A1 * | 4/2015 | Dehe | G01N 29/30 73/24.02 |
| 2016/0334279 | A1 * | 11/2016 | Mittleman | G08B 13/189 |

(Continued)

FOREIGN PATENT DOCUMENTS

| CN | 101644696 A | 2/2010 |
|---|---|---|
| CN | 110023748 A | 7/2019 |

(Continued)

OTHER PUBLICATIONS

International Search Report and Written Opinion from PCT/US2023/025898 dated Oct. 11, 2023, 12 pgs.

(Continued)

*Primary Examiner* — Freddie Kirkland, III
(74) *Attorney, Agent, or Firm* — Schwabe, Williamson & Wyatt, P.C.

(57) ABSTRACT

Embodiments disclosed herein include sensor devices. In an embodiment, a sensor device comprises a substrate, a first sensor of a first type on the substrate, where a catalytic layer is provided as at least part of the first sensor, a second sensor of the first type on the substrate and adjacent to the first sensor, and a lid over the substrate, where an opening through the lid is provided over the first sensor and the second sensor.

19 Claims, 8 Drawing Sheets

(56) References Cited

U.S. PATENT DOCUMENTS

2022/0122865 A1    4/2022   Santhanam et al.
2022/0196585 A1    6/2022   Barraza et al.

FOREIGN PATENT DOCUMENTS

| JP | H08170953 A | 7/1996 |
|---|---|---|
| KR | 1020030055341 A | 7/2003 |
| TW | 201715230 A | 5/2017 |

OTHER PUBLICATIONS

International Preliminary Report on Patentability for PCT/US2023/025898 dated Feb. 6, 2025, 8 pgs.
Official Letter from Taiwan Patent Application No. 112125792 dated Jul. 28, 2025, 16 pgs.

\* cited by examiner

RADICAL SENSOR SUBSTRATE

BACKGROUND

1) Field

Embodiments relate to the field of semiconductor manufacturing and, in particular, to sensor substrates that include sensors for detecting one or more process conditions in a semiconductor processing tool.

2) Description of Related Art

The use of radical species is common in semiconductor processing operations. For example, radical species can be used for etching processes, deposition processes, or the like. However, the concentration of radical species is difficult to quantify in existing semiconductor processing tools. Accordingly, test substrates may need to be run in order to determine the radical species concentration of a given processing operation. Even still, such analysis does not provide a measure of the radical species themselves. Only the end effect of the radical species can be determined.

In addition to radical species sensing, other process parameters may also be necessary in order to refine processing conditions and implement chamber matching. For example, temperature, pressure, and the like may also be needed in order to match chambers.

SUMMARY

Embodiments disclosed herein include sensor devices. In an embodiment, a sensor device comprises a substrate, a first sensor of a first type on the substrate, where a catalytic layer is provided as at least part of the first sensor, a second sensor of the first type on the substrate and adjacent to the first sensor, and a lid over the substrate, where an opening through the lid is provided over the first sensor and the second sensor.

Embodiments disclosed herein may also include a method of determining a process parameter of a semiconductor processing recipe. In an embodiment, the method comprises inserting a sensor substrate with a first sensor with a catalytic coating and a second sensor without a catalytic coating into a semiconductor processing tool, igniting a plasma in the semiconductor processing tool, obtaining temperature readings with the first sensor and the second sensor, and calculating a radical density of the plasma from a difference in the temperature readings of the first sensor and the second sensor.

Embodiments disclosed herein may also include a method of controlling a process parameter of a semiconductor processing recipe. In an embodiment, the method comprises providing an artificial intelligence (AI) model and/or machine learning (ML) model of a semiconductor processing tool, obtaining in-situ sensor readings with sensors provided on a substrate that is inserted into the semiconductor processing tool, using the sensor readings as an input to train the AI model and/or the ML model, and deploying the AI model and/or the ML model to change one or more process parameters of the semiconductor processing recipe.

DETAILED DESCRIPTION

Figure 1:
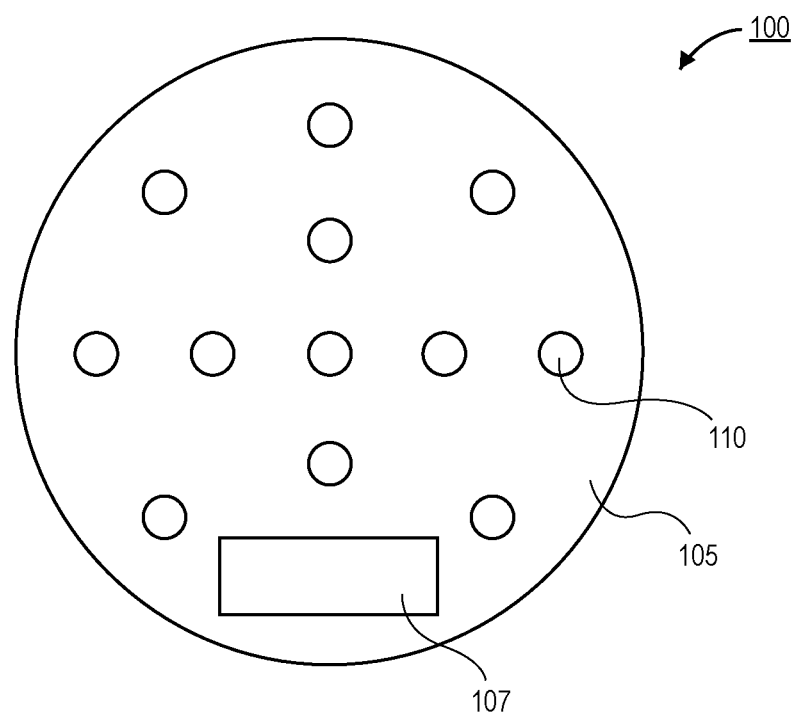
FIG. 1 is a plan view illustration of a sensor substrate that includes a plurality of sensors for determining radical species concentrations, in accordance with an embodiment.

Systems described herein include sensor substrates that include sensors for detecting one or more process conditions in a semiconductor processing tool. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, the ability to determine radical species concentrations is desirable for many different reasons in a semiconductor processing tool. For example, knowledge of radical species concentration can be used in order to improve process uniformity and improve chamber matching operations. However, there are currently no devices that enable radical species concentration measurement in-situ.

Accordingly, embodiments disclosed herein include sensor substrates that enable radical species concentration measurements. As used herein, radical species concentration may also be referred to as radical concentration or free radical concentration. In an embodiment, radicals may include atoms or molecules containing one or more unpaired electrons in the valency shell or outer orbit. In an embodiment, the odd number of electrons in a free radical makes the radical unstable and highly reactive. As such, the radical species is useful for either etching or deposition processes. Some common radical species include hydrogen (H), oxygen (O), and nitrogen (N). The free radicals may be generated by flowing gas into a processing chamber and striking a plasma. Though other methods of forming free radicals may also be used.

Radicals may be detected by including a catalytic material on the sensor substrate. The catalytic material may selectively interact with the radical species. The reaction of the catalytic material and the radicals may result in a temperature increase. The increase in temperature may be correlated to the concentration of radical species. That is, when there is a relatively greater concentration of a radical species, the temperature of the catalytic material will be higher than when there is a relatively lower concentrations of the radical species. In order to provide a more accurate measurement of radical concentration, the sensor substrate may include a first temperature sensor without a catalytic coating and a second temperature sensor with a catalytic coating. Accordingly, a differential temperature measurement may be provided in order to isolate the effect of heating due to the radical species reaction. In an embodiment, the temperature measurement sensor may include a thermocouple, a thermopile, a Wheatstone bridge, a resonator, or any other temperature sensor architecture.

While embodiments disclosed herein are particularly beneficial for determining radical species concentrations, embodiments may also include sensor substrates that include functionality to measure temperature, pressure, and the like within the chamber. For example, thermocouples, thermopiles, Wheatstone bridges, or resonators may be used to measure temperature within a semiconductor processing tool. Additionally, sensors, such as resonators or Pirani sensors, may be capable of providing pressure measurements. For example, as the pressure changes, the resonant frequency of the resonator may change. Other type of sensors may also be used to determine the amount of deposition or etching of a layer.

In addition to finding process conditions in-situ, embodiments may include functionality to feed the in-situ measurements to machine learning (ML) and/or artificial intelligence (AI) modules. The ML and/or AI modules may include digital twin functionality. The measured process conditions may be used to inform or train the ML and/or AI modules. The use of an ML and/or AI module may be useful for applications, such as chamber matching, chamber seasoning, and the like.

Referring now to FIG. 1, a plan view illustration of a sensor substrate 100 is shown, in accordance with an embodiment. In an embodiment, the sensor substrate 100 may have a form factor of a semiconductor wafer (e.g., a silicon wafer). For example, a diameter of the sensor substrate 100 may be 200 mm, 300 mm, or 450 mm. Though, other form factors may also be used for the sensor substrate 100. In an embodiment, a thickness of the sensor substrate 100 may be approximately 10 mm thick or less, or approximately 6 mm thick or less. The thickness of the sensor substrate 100 may be suitable for handling the sensor substrate 100 in a semiconductor processing tool using existing robot handling solutions. As such, the sensor substrate 100 may be inserted and retracted from the processing tool without needing to open the chamber.

In an embodiment, the sensor substrate 100 may include a substrate 105. The substrate 105 may be any suitable material. In a particular embodiment, the substrate 105 may be or contain an electrical board (e.g., an organic or ceramic board such as a printed circuit board (PCB) or the like). The substrate 105 may include electrical routing (not shown) in order to electrically couple sensors 110 to a control module 107.

The sensors 110 may include any type of sensor suitable for measuring temperature. For example, the sensors 110 may include thermocouples, thermopiles, thermistors, resistance bridges (e.g., a Wheatstone bridge), resonators, and the like. In a particular embodiment, the sensors 110 may each include a pair of sensors. A first sensor may be without a catalytic layer and the second sensor may have a catalytic layer. As such, differential temperature readings may be provided in order to accurately measure the radical concentration within a semiconductor processing tool.

In an embodiment, there may be any number of sensors 110. For example, five or more sensors 110, ten or more sensors 110, or fifty or more sensor 110, may be included on the sensor substrate 100. The sensors 110 may be arranged in any desirable pattern in order to determine the radical species concentration across the entire substrate. For example, sensors 110 may be provided proximate to the center of the sensor substrate 100, to the edge of the sensor substrate 100, and between the center and the edge. In an embodiment, the sensing area of each sensor 110 may be between 1 $mm^2$ and 20 $mm^2$. For example, the sensing area of each sensor 110 may be approximately 10 $mm^2$ in some embodiments.

In an embodiment, the control module 107 may include a processor and a memory. The processor may be used in order to control the sensors 110 and the memory may store temperature readings. The processor may also be capable of determining radical concentrations from differential temperature readings. Sampling rates of the sensors 110 may be between 1 Hz and 10 Hz, though embodiments may include sampling rates up to 100 Hz or higher. In an embodiment, the control module 107 may also comprise a battery or other power source in order to power the sensors 110.

In an alternative embodiment, one or more of the processor, the memory, and the power source may be removed from the sensor substrate 100. For example, wireless power, wireless sensor driving (e.g. for resonator sensors), and wireless communications may be used in some embodiments. Offloading some of the processor, memory, and power applications from the sensor substrate 100 may enable higher operation temperatures (e.g., up to 400° C. or up to 500° C.) for the sensor substrate 100.

Figure 2:
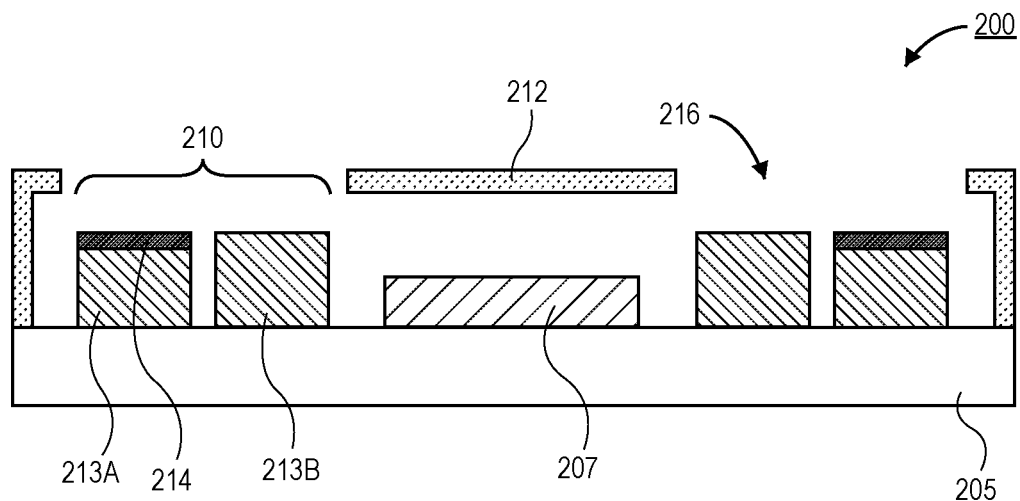
FIG. 2 is a cross-sectional illustration of a sensor substrate that includes sensors for determining radical species concentrations and a processor module below a lid, in accordance with an embodiment.

Referring now to FIG. 2, a cross-sectional illustration of a sensor substrate 200 is shown, in accordance with an embodiment. In an embodiment, the sensor substrate 200 may include a base substrate 205, such as a PCB or a plain ceramic or metal carrier. In an embodiment, a plurality of sensor 210 may be provided over the base substrate 205. In an embodiment, each of the sensors 210 may include a reference sensor 213B and a catalytic sensor 213A. The reference sensor 213B can be exposed or completely covered by the lid 212. The catalytic sensor 213A may include a catalytic layer 214. The catalytic layer 214 is chosen as a material that preferentially reacts with the radical species of interest. For example, hydrogen radicals may preferentially react with gold (Au), stainless steel, silver (Ag), platinum (Pt), or copper (Cu). Oxygen may preferentially react with Cu, stainless steel, or gold. Nitrogen may preferentially react with Cu, gold, or stainless steel. The thickness of the catalytic layer 214 may be approximately 10 μm or less, approximately 1 μm or less, or approximately 500 nm or less. While shown as distinct components, it is to be appreciated that reference sensor 213B and catalytic sensor 213A may be integrated as a single sensor component.

In an embodiment, the sensor substrate 200 may include a single type of catalytic material for the catalytic layer 214. In other embodiments, different catalytic materials may be provided for the various catalytic layers 214. As such, the concentration of more than one type of radical species can be determined by the sensor substrate 200. For example, the catalytic layers 214 may include two or more of Cu, Au, and stainless steel.

In an embodiment, the catalytic sensor 213A and the reference sensor 213B may be any suitable sensors, such as those described in greater detail below. The temperature of the catalytic sensor 213A can be compared to the temperature of the reference sensor 213B in order to determine how much of the temperature increase corresponds to the radical species reaction with the catalytic layer 214. After the amount of heating caused by the radical species reaction is known, a correlation to the radical species concentration can be determined.

In an embodiment, the sensor substrate 200 may comprise a lid 212. The lid 212 may protect certain portions of the sensor substrate 200 from exposure to the processing environment. For example, the control module 207, electrical routing, and the like may be covered by the lid 212. In an embodiment, the lid 212 may include openings 216. The openings expose the sensors 210 or only the catalytic sensor 213A to the processing environment in order to measure process conditions, such as radical species concentrations. The lid 212 may be any suitable material, such as a plastic, a metal, a ceramic, or the like. The lid 212 may be resistant to the processing environment under investigation. For example, the lid 212 may be a material that is resistant to an etching chemistry (e.g., a hydrogen etching chemistry).

Figure 3:
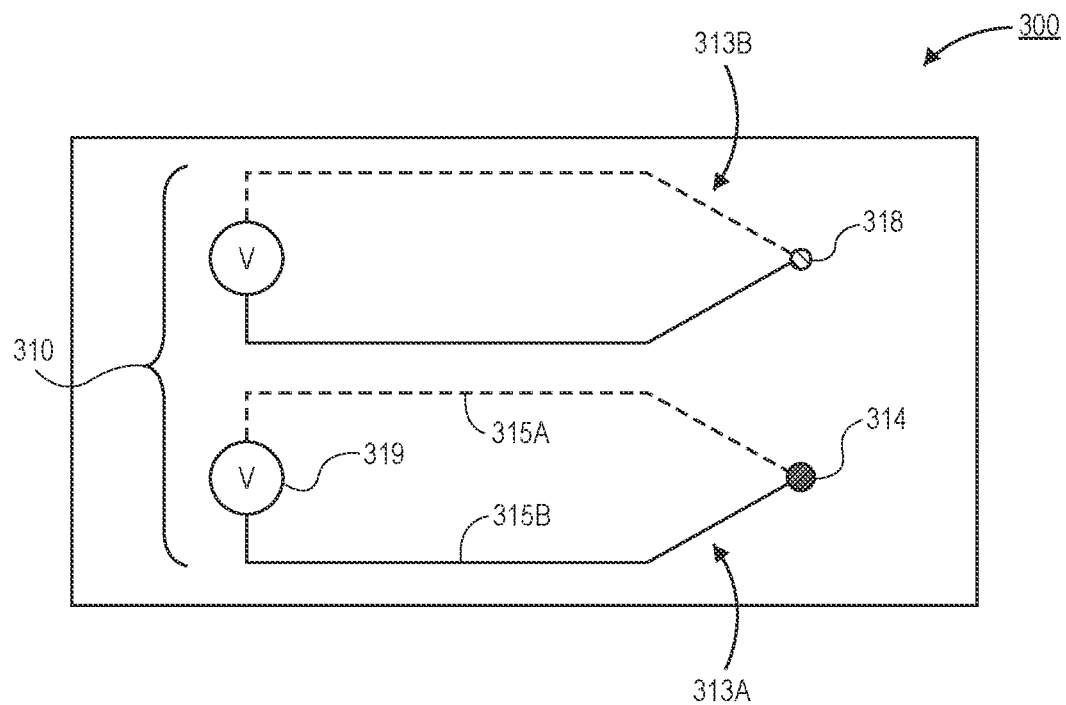
FIG. 3 is a plan view illustration of a thermocouple sensor architecture used to determine radical species concentrations, in accordance with an embodiment.

Referring now to FIG. 3, a plan view illustration of a temperature sensor 310 that can be used for a sensor substrate 300 is shown, in accordance with an embodiment. As shown, the sensor 310 comprises a first sensor 313A and a second sensor 313B. The first sensor 313A may include a catalytic layer 314 over the sensor probe 318. The second sensor 313B may include a bare sensor probe 318.

The sensors 313 may be thermocouple sensors. That is, first conductive traces 315A and second conductive traces 315 may be coupled to opposite ends of a voltage meter 319. The conductive trace 315A is a different material than the conductive trace 315B. While a particular thermocouple architecture is shown in FIG. 3, it is to be appreciated that any thermocouple architecture may be used. As temperature increases, the voltage of the voltage meter 319 increases. The measured voltage may be correlated to a temperature of the sensor probe 318. Particularly, when exposed to radical species, the catalytic layer 314 increases in temperature greater than the temperature of the sensor probe 318. By comparing the temperature of the sensor probe 318 of the sensor 313B to the temperature of the sensor probe 318 of the sensor 313A (which is under the catalytic layer 314), a correlation to the radical concentration can be determined. In an embodiment, the sensor 313A is substantially similar to the sensor 313B, with the exception of the inclusion of the catalytic layer 314.

Figure 4:
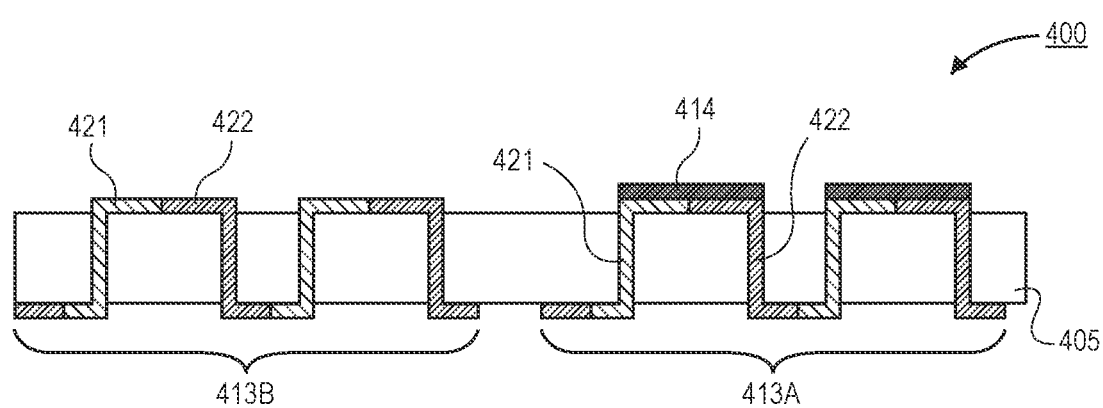
FIG. 4 is a cross-sectional illustration of a thermopile that is used to determine radical species concentrations, in accordance with an embodiment.

Referring now to FIG. 4, a cross-sectional illustration of a sensor substrate 400 is shown, in accordance with an embodiment. In an embodiment, the sensor substrate 400 may include a pair of thermopiles 413A and 413B that pass through the base substrate 405. In an embodiment, the thermopiles 413A and 413B may include alternating conductive traces 421 and 422. The traces 421 may be a different conductive material than the traces 422. As such, the thermopiles 413 allow for temperature readings, due to the voltage difference between the traces 421 and 422. While a particular thermopile architecture is shown in FIG. 4, it is to be appreciated that any thermopile architecture may be used in embodiments disclosed herein.

In an embodiment, the first thermopile sensor 413A may include a catalytic layer 414. The catalytic layer 414 may be provided over top surfaces of the thermopile sensor 413A. The second thermopile sensor 413B may be provided without a catalytic layer 414. In an embodiment, the first thermopile sensor 413A may be substantially similar to the second thermopile sensor 413B, with the exception of the inclusion of the catalytic layer 414. As such, a differential temperature reading between the first thermopile sensor 413A and the second thermopile sensor 413B can be determined. The differential temperature reading may be correlated to a radical species concentration. In other embodiments, the thermopile sensors 413A and 413B may be coplanar and on the same surface (and sitting on a membrane to isolate the hot side from the cold side).

Figure 5:
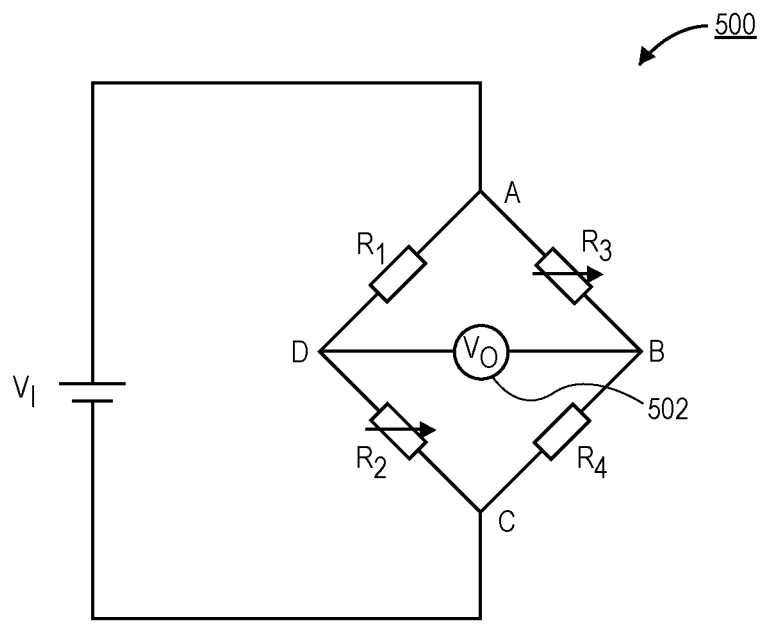
FIG. 5 is a schematic illustration of a Wheatstone bridge that is used to determine radical species concentrations, in accordance with an embodiment.

Referring now to FIG. 5, a schematic of a sensor substrate 500 is shown, in accordance with an embodiment. As shown, the sensor architecture may include a resistance bridge architecture. In a particular embodiment, the resistance bridge architecture is a Wheatstone bridge architecture. For example, a set of four resistors R1-R4 may be provided in a ring architecture and connected to a power source. For example, node A may be coupled to a positive terminal of the power source, and node C may be coupled to a negative terminal of the power source. Terminals D and B may be coupled to a volt meter circuits 502 to measure an output voltage (Vo).

In an embodiment, two opposing resistors R may include a catalytic layer (not shown), and the remainder of the resistors R may be formed without a catalytic layer. For example, resistors R2 and R3 may include a catalytic layer. The resistors R2 and R3 may also be variable resistors (as indicated by the line through the resistors R2 and R3). In other embodiments, the resistors R1 and R4 may be the resistors with the catalytic layer, and the resistors R2 and R3 may be formed without the catalytic layer. That is, any two of the resistors that are on opposite sides of the bridge can be chosen as the resistors covered by the catalytic material. Additionally, any number of the resistors R1-R4 may be variable resistors.

Figure 6:
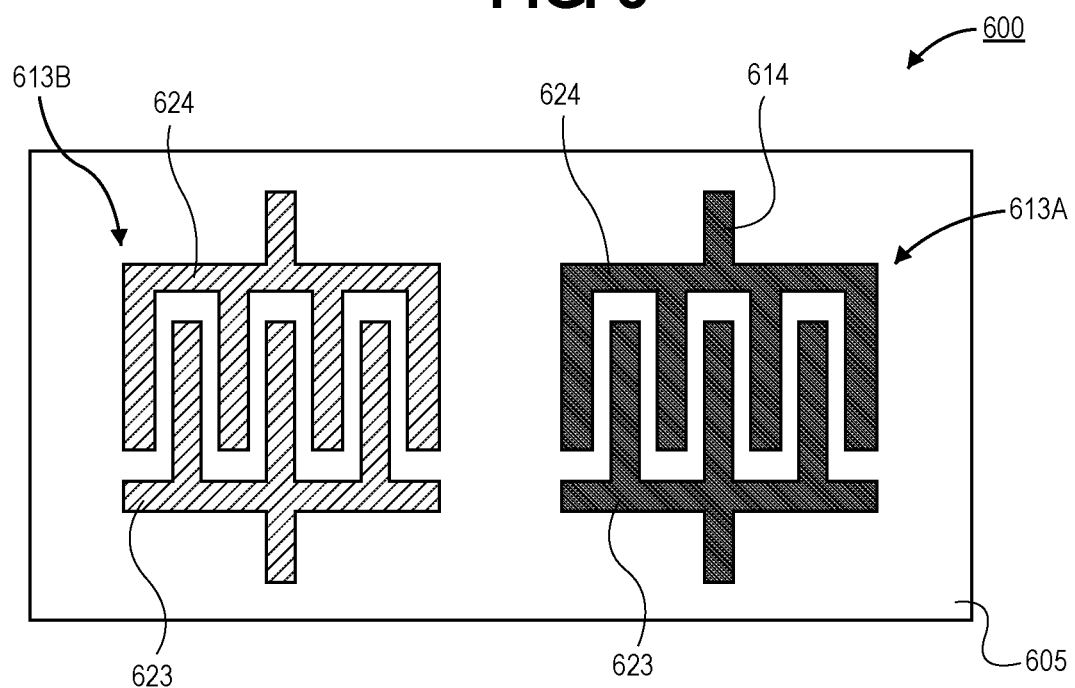
FIG. 6 is a plan view illustration of a sensor substrate with (acoustic) resonator sensors for determining radical species concentrations, in accordance with an embodiment.

Referring now to FIG. 6, a plan view illustration of a sensor substrate 600 is shown, in accordance with an embodiment. As shown, a pair of resonators 613A and 613B may be provided over a substrate 605. Each of the resonators may include a first interdigitated structure 623 and a second interdigitated structure 624. For example, the resonators 613 may be surface acoustic wave (SAW) resonators, bulk acoustic wave (BAW) resonators, or any other type of MEMS resonator architecture. The resonators 613 may be any suitable material for providing resonator structures. For example, the resonators 613 may include a piezoelectric material. Additionally, while three and four interdigitated fingers are shown, it is to be appreciated that any number of interdigitated fingers may be used. While interdigitated fingers are shown, other resonator architectures may also be used.

The resonators 613 may detect temperature. For example, changes in temperature of the resonators 613 may result in a change to the resonance frequency of the resonators 613. Additionally, pressure changes or layer thicknesses (e.g., from deposition or etching) may also be detected by the resonators 613. Changes to the pressure and/or layer thickness may also result in a predictable change in the resonant frequency of the resonators 613.

In an embodiment, the first resonator 613A may include a catalytic layer 614 over the interdigitated structures 623 and 624. The first resonator 613A may be adjacent to a second resonator 613B that does not include a catalytic layer 614. The second resonator 613B can, therefore, function as a reference signal in order to provide differential measurement of the increase in temperature attributable to the radical species reaction with the catalytic layer 614.

In the embodiments described in greater detail above, the temperature sensor architectures are all provided at a single Z-height. Such embodiments are useful for providing a spatial analysis of the radical species concentration. That is, the radical species concentration in the X-Y plane can be determined. However, it is to be appreciated that radical species concentrations may also vary in the Z-direction. Accordingly, embodiments described herein may also include structures that enable radical species densities to be measured at two or more Z-heights within the chamber.

Figure 7:
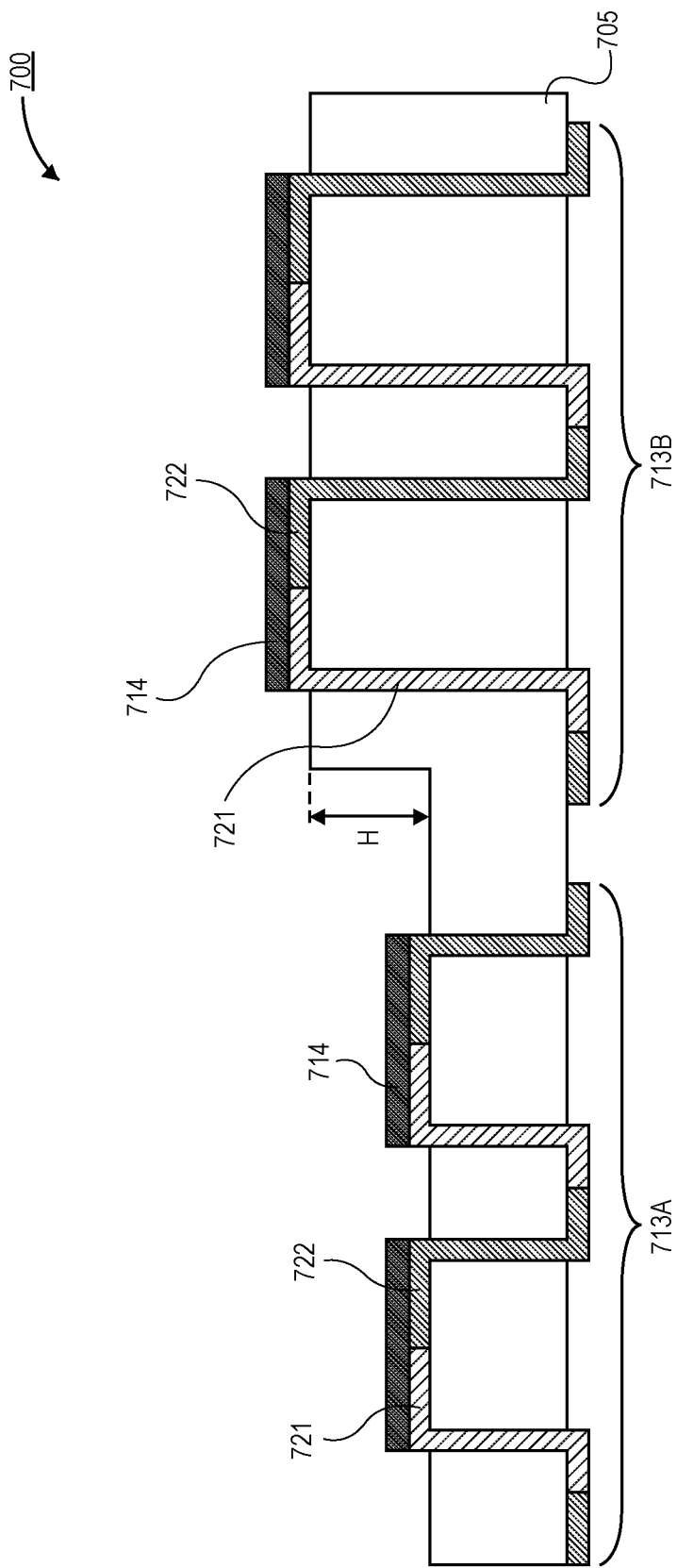
FIG. 7 is a cross-sectional illustration of a sensor substrate with a first sensor at a first Z-height and a second sensors at a second Z-height, in accordance with an embodiment.

An example of such an embodiment is shown in FIG. 7. As shown, the sensor substrate 700 may include a substrate 705 that includes multiple thicknesses. For example, a first thickness may be smaller than a second thickness by a distance H. The distance H may be approximately 1 mm or greater or approximately 5 mm or greater. Though, it is to be appreciated that distance H may also be less than 1 mm in some embodiments. Additionally, while two different thicknesses are shown, it is to be appreciated that any number of different thicknesses may be provided adjacent to each other.

In an embodiment, a first sensor 713A may be provided on a first portion of the substrate 705, and a second sensor 713B may be provided on a second portion of the substrate 705. The top of the second sensor 713B may be higher than a top of the first sensor 713A. As such, temperature variations (and thus, radical concentrations) can be provided for different Z-heights.

In the illustrated embodiment, the sensors 713A and 713B are similar to the sensors 413A in FIG. 4. That is, each of the sensors 713 are thermopiles that include first conductors 721 and second conductors 722. The sensors 713 may also both be covered by a catalytic layer 714. In an embodiment, similar sensors, but without the catalytic layer 714 (not shown) are provided adjacent to both the first sensor 713A and the second sensor 713B. The sensors without catalytic converter layers may be provided adjacent and at the same height as the first sensor 713A and the second sensor 713B.

While an example of a thermopile sensor is shown in FIG. 7, it is to be appreciated that any of the temperature sensor architectures described herein can be used to measure radical concentration variations in the Z-direction. For example, thermocouples, resistor bridges, and/or resonators may be used in an architecture similar to the architecture shown in FIG. 7.

Figure 8:
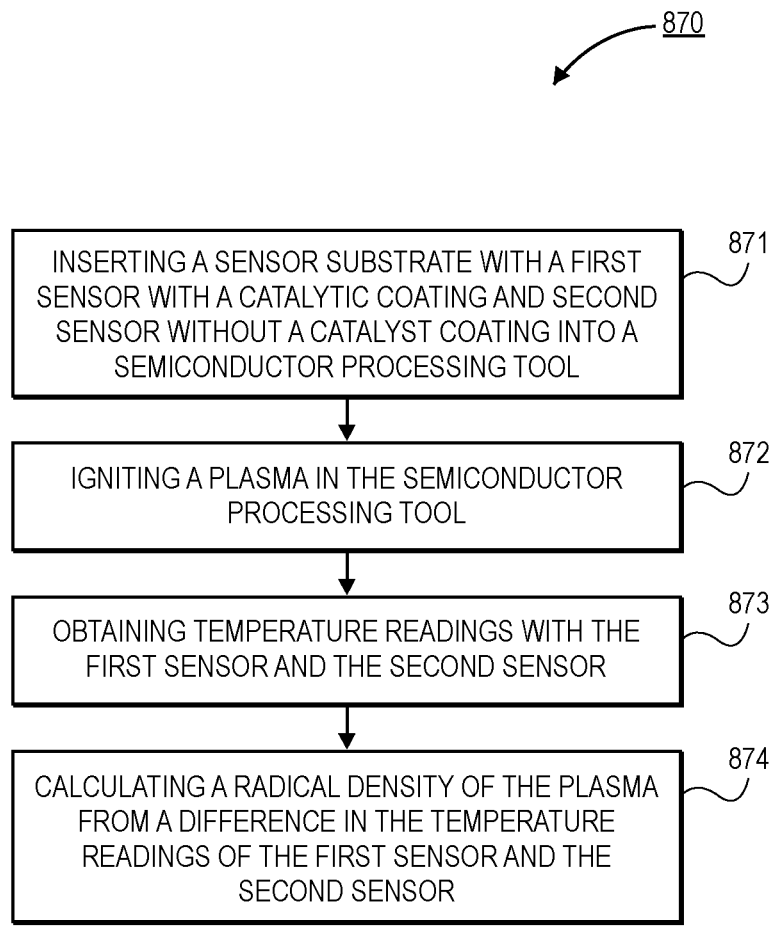
FIG. 8 is a process flow diagram of a process for measuring radical species density of a plasma with a sensor substrate, in accordance with an embodiment.

Referring now to FIG. 8, a process flow diagram depicting a process 870 for determining a radical density of a plasma process is shown, in accordance with an embodiment.

In an embodiment, the process 870 may begin with operation 871, which includes inserting a sensor substrate with a first sensor with a catalytic coating and a second sensor without a catalytic coating into a semiconductor processing tool. In an embodiment, the first sensor may be provided adjacent to the second sensor. The first sensor and the second sensors may be the same type of sensor. For example, the first sensor and the second sensor may include thermocouples, thermopiles, resistance bridges, resonators, or the like. In a particular embodiment, sensors similar to any of the sensors described in greater detail above may be used with the sensors substrate.

In an embodiment, the catalytic coating may include any suitable material, such as gold, copper, stainless steel, silver, platinum, or the like and have varying sensing area size or height, and the like. The catalytic coating may be chosen in order to selectively detect radicals such as hydrogen, oxygen, and/or nitrogen. While described as having a pair of sensors (one with a catalytic coating, and one without a catalytic coating), it is to be appreciated that the sensor substrate may include any number of sensor pairs. Each sensor pair may include an uncoated sensor and a catalytic coated sensor. These sensor variation/combination can be used to more precisely derive the radicals density with algorithms including ML.

In an embodiment, the process 870 may continue with operation 872, which comprises igniting a plasma in the semiconductor processing tool. In an embodiment, the semiconductor processing tool may be a tool for any suitable semiconductor processing operation. For example, the semiconductor processing tool may be an etching tool, a deposition tool, a plasma treatment tool, or the like. In an embodiment, the plasma is ignited over the sensor substrate. When the sensor substrate provides multiple sensor pairs, the sensor pairs may be distributed across the substrate in order to measure spatial radical density. In some embodiments, sensor pairs may also be provided at different Z-heights in order to determine differences in radical species at different Z-heights within the chamber.

In an embodiment, the process 870 may continue with operation 873, which comprises obtaining temperature readings with the first sensor and the second sensor. Due to the presence of the catalytic coating on the first sensor, the temperature of the first sensor is expected to be higher than the temperature of the second sensor. The second sensor serves as a reference in order to isolate the effect of radical reaction with the catalytic coating.

In an embodiment, the process 870 may continue with operation 874, which comprises calculating a radical density of the plasma from a difference in the temperature readings of the first sensor and the second sensor. Particularly, the radical density can be correlated to the temperature difference between the first sensor and the second sensor. For example, relatively higher temperature differences correspond to higher radical densities, and relatively lower temperature differences correspond to lower radical densities.

Figure 9:
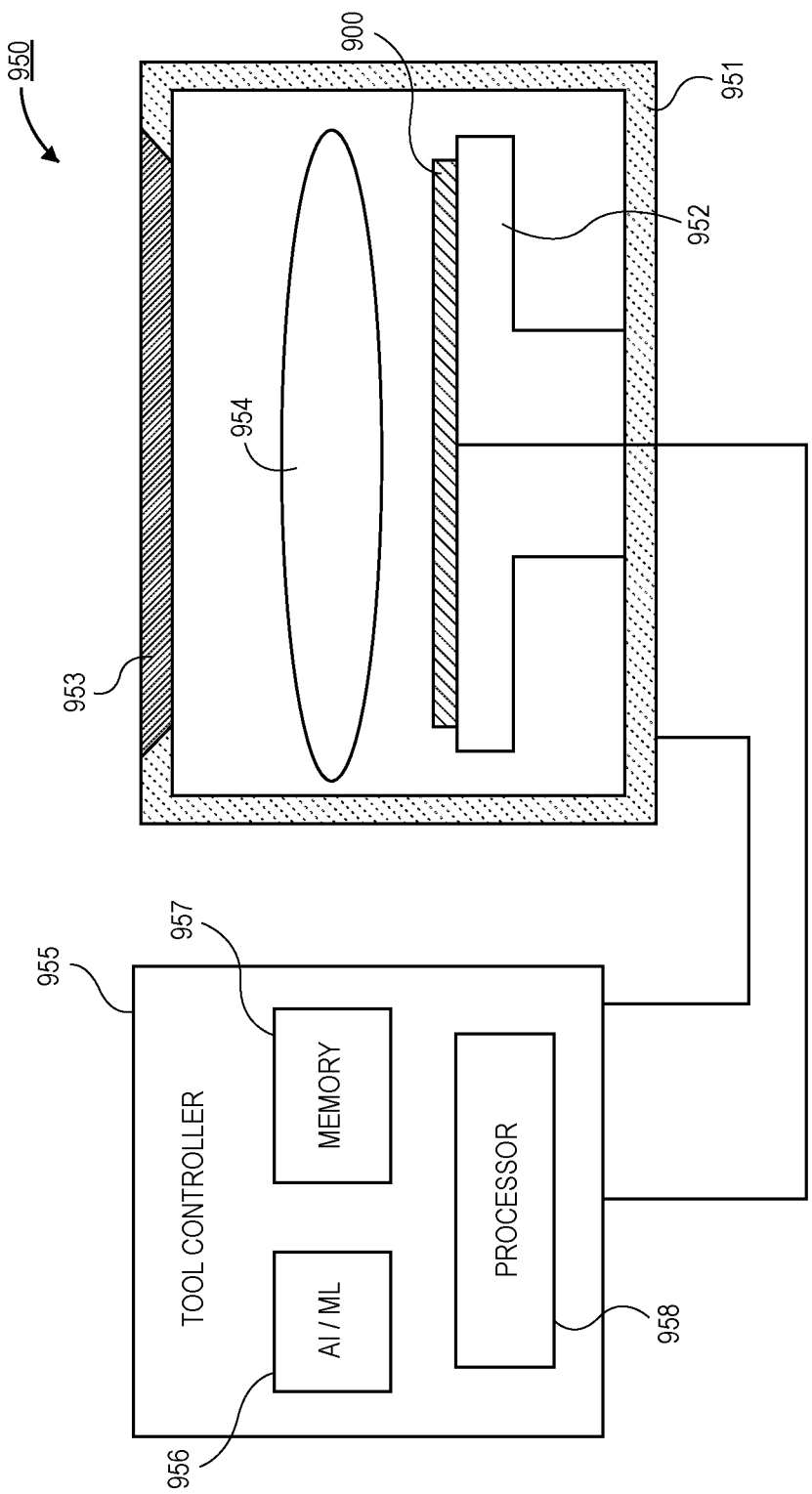
FIG. 9 is an illustration of a semiconductor processing tool that includes a tool controller with a machine learning (ML) or artificial intelligence (AI) module that receives feedback from a sensor substrate, in accordance with an embodiment.

Referring now to FIG. 9, an illustration of a semiconductor processing tool 950 is shown, in accordance with an embodiment. In an embodiment, the semiconductor processing tool 950 may comprise a chamber 951 with a lid 953. Plasma 954 may be ignited within the chamber 951. A sensor substrate 900 (e.g., similar to any of the sensor substrates described herein) may be provided on a chuck 952, pedestal, or the like.

In an embodiment, the semiconductor processing tool 950 may further comprise a tool controller 955. The tool controller 955 may include a processor 958. The processor 958 may provide instructions to the semiconductor processing tool 950 for processing substrates. The processor 958 may have access to a memory 957 and an AI/ML module 956. The tool controller 955 may be coupled to the chamber 951 to control processes within the semiconductor processing tool 950 and coupled to the sensor substrate 900.

In an embodiment, the AI/ML module 956 may take radical concentration measurements (or any other type of measurement) from the sensor substrate 900 and use the information to refine one or more processing conditions within the semiconductor processing tool 950. The AI/ML module may include a digital twin feature of the semiconductor processing tool 950. For example, the digital twin may include a digital representation of the processing environment. The digital twin may include a model that is derived from physics based equations of the chamber structure and processing conditions (e.g., gas flow rates, RF frequencies, temperature, pressure, etc.). As such, the data derived from the one or more sensors may be used as feedback information to more accurately model the behavior of the semiconductor processing tool 950.

Additionally, the AI/ML module 956 may be used for other processes, such as chamber seasoning operations, chamber matching, and the like. For example, proper chamber seasoning may be identified by monitoring the changes to radical density. That is, when a chamber is properly seasoned, the radical density distribution may be more uniform throughout the chamber. Additionally, chamber matching operations may be implemented between chambers using the AI/ML module 956. For example, processing conditions can be changed in order to match radical density metrics. That is, instead of simply matching the processing parameters (e.g., same gas flow rates, same frequencies, same durations, etc.) between tools, the AI/ML module 956 allows for matching the process conditions, such as a specific radical density between chambers. More particularly, processing parameters refer to the setting of one or more knobs that control a process, and the processing conditions are the actual conditions (e.g., temperature, pressure, radical density, etch rate, deposition rate, etc.) that are experienced in the chamber.

Additionally, while particular reference is made to radical density matching, similar matching for other process conditions is possible. For example, sensor substrates may include temperature measurements, pressure measurements, deposition thickness measurements, etching measurements, and the like. The AI/ML module 956 may use that information in order to more properly match processing conditions between chambers, as opposed to simply matching processing parameters.

Figure 10:
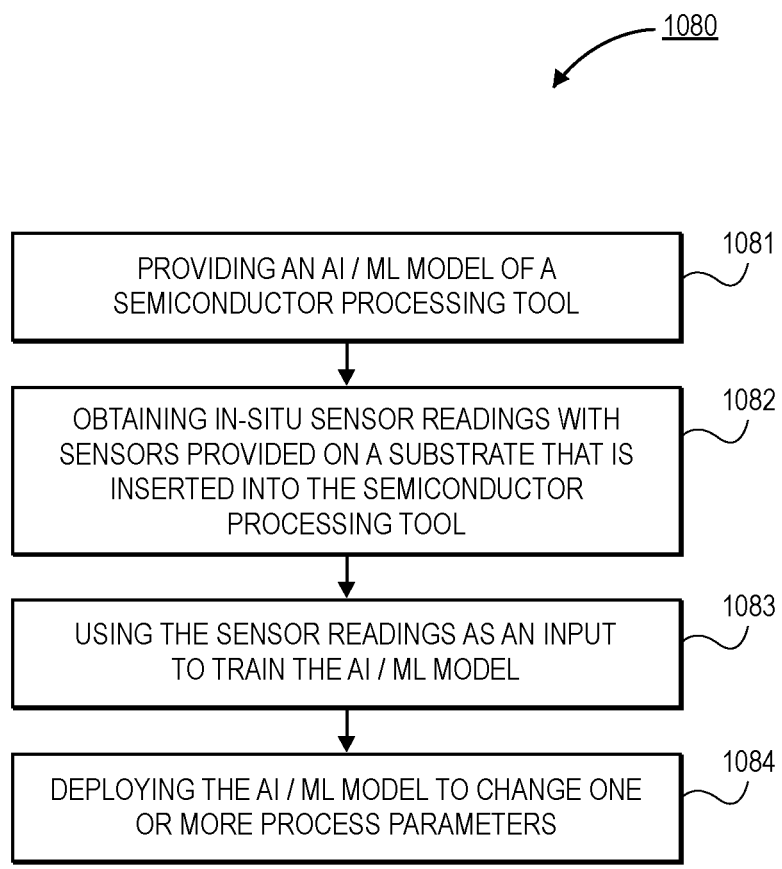
FIG. 10 is a process flow diagram of a process for using a sensor substrate to inform an AI and/or ML algorithm in order to change one or more processing parameters of the semiconductor tool, in accordance with an embodiment.

Referring now to FIG. 10, a process flow diagram of a process 1080 for using sensor substrates and AI/ML modules to improve processing is shown, in accordance with an embodiment.

In an embodiment, process 1080 may begin with operation 1081, which comprises providing an AI/ML model of a semiconductor processing tool. For example, the AI/ML model may be similar to the AI/ML module 956 described in greater detail above. For example, the AI/ML model may include a physics based model that is informed and/or trained by one or more sensors provided within the semiconductor processing tool In an embodiment, process 1080 may continue with operation 1082, which comprises obtaining in-situ sensor readings with sensors provided on a substrate that is inserted into the semiconductor processing tool. For example, the sensors may be suitable for determining radical density concentration, temperature, pressure, etch rate, deposition rate, or the like. In a particular embodiment, the sensor substrate may be similar to any of the sensor substrates described in greater detail herein.

In an embodiment, the process 1080 may continue with operation 1083, which comprises using the sensor readings as an input to train the AI/ML model. In an embodiment, the training data may be integrated into the physics based model, or any other type of model employed by the AI/ML model. The improved model will allow for the process parameters to more accurately map to the actual processing conditions within the chamber. Since processing conditions are matched, instead of just processing parameters, improved performance and improved chamber matching are possible.

In an embodiment, the process 1080 may continue with operation 1084, which comprises deploying the AI/ML model to change one or more processing parameters. Due to the additional data obtained from the sensor substrate, the AI/ML model has a more accurate understanding of how changing one or more processing parameters will alter the actual processing conditions.

In some embodiments, the AI/ML model is deployed to improve the processing within a single chamber. For example, the AI/ML model may determine when the chamber is properly seasoned. In other embodiments, the AI/ML model is deployed to improve chamber matching between different chambers.

Figure 11:
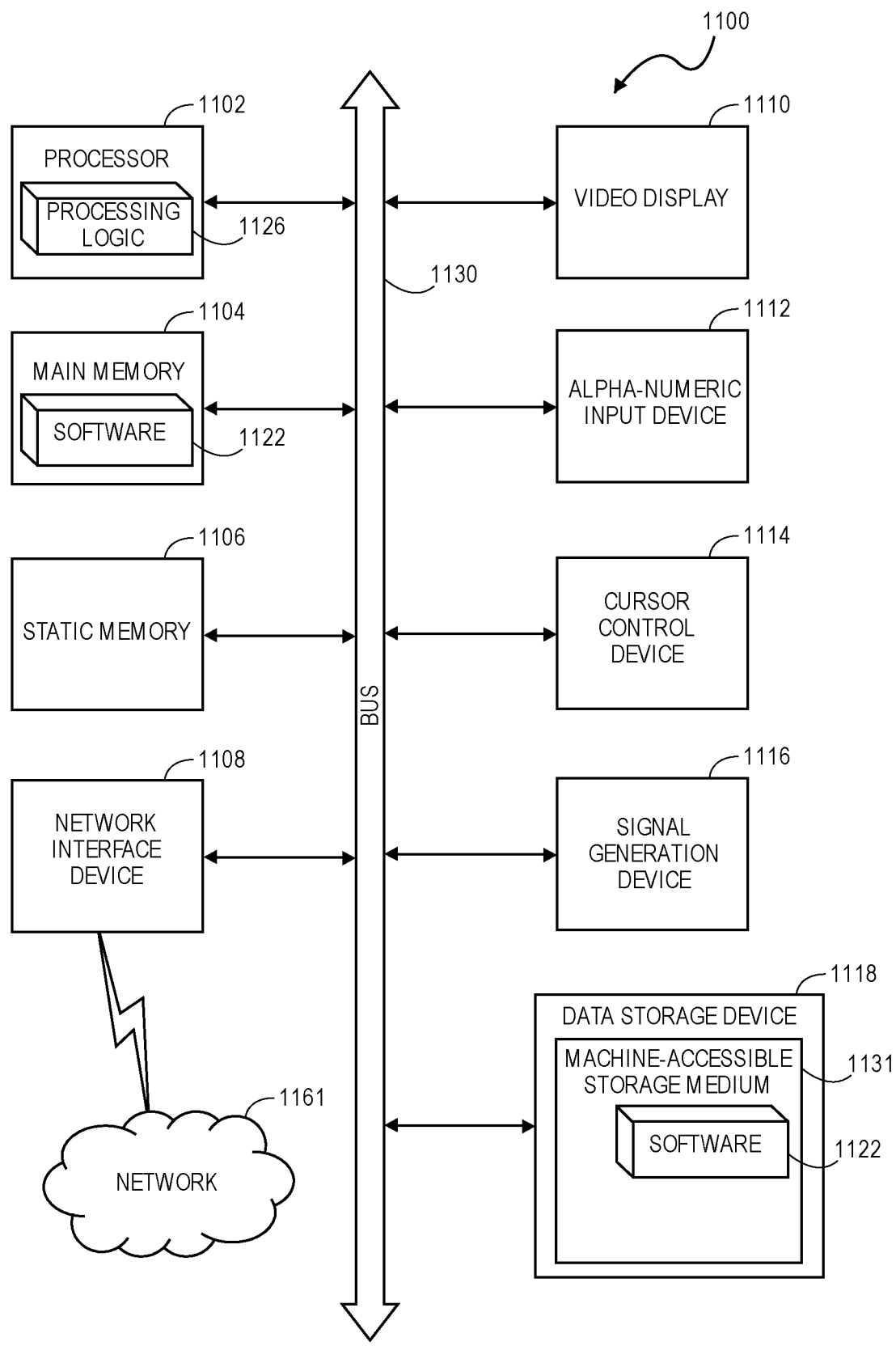
FIG. 11 illustrates a block diagram of an exemplary computer system that may be used in conjunction with a processing tool, in accordance with an embodiment.

Referring now to FIG. 11, a block diagram of an exemplary computer system 1100 of a processing tool is illustrated in accordance with an embodiment. In an embodiment, computer system 1100 is coupled to and controls processing in the processing tool. Computer system 1100 may be connected (e.g., networked) to other machines in a Local Area Network (LAN), an intranet, an extranet, or the Internet. Computer system 1100 may operate in the capacity of a server or a client machine in a client-server network environment, or as a peer machine in a peer-to-peer (or distributed) network environment. Computer system 1100 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 1100, the term "machine" shall also be taken to include any collection of machines (e.g., computers) that individually or jointly execute a set (or multiple sets) of instructions to perform any one or more of the methodologies described herein.

Computer system 1100 may include a computer program product, or software 1122, having a non-transitory machine-readable medium having stored thereon instructions, which may be used to program computer system 1100 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 1100 includes a system processor 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a secondary memory 1118 (e.g., a data storage device), which communicate with each other via a bus 1130.

System processor 1102 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1102 may also be one or more special-purpose processing devices such as an application specific integrated circuit (ASIC), a field programmable gate array (FPGA), a digital signal system processor (DSP), network system processor, or the like. System processor 1102 is configured to execute the processing logic 1126 for performing the operations described herein.

The computer system 1100 may further include a system network interface device 1108 for communicating with other devices or machines. The computer system 1100 may also include a video display unit 1110 (e.g., a liquid crystal display (LCD), a light emitting diode display (LED), or a cathode ray tube (CRT)), an alphanumeric input device 1112 (e.g., a keyboard), a cursor control device 1114 (e.g., a mouse), and a signal generation device 1116 (e.g., a speaker).

The secondary memory 1118 may include a machine-accessible storage medium 1132 (or more specifically a computer-readable storage medium) on which is stored one or more sets of instructions (e.g., software 1122) embodying any one or more of the methodologies or functions described herein. The software 1122 may also reside, completely or at least partially, within the main memory 1104 and/or within the system processor 1102 during execution thereof by the computer system 1100, the main memory 1104 and the system processor 1102 also constituting machine-readable storage media. The software 1122 may further be transmitted or received over a network 1120 via the system network interface device 1108. In an embodiment, the network interface device 1108 may operate using RF coupling, optical coupling, acoustic coupling, or inductive coupling.

While the machine-accessible storage medium 1132 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A sensor device, comprising:
   a substrate;
   a first sensor of a first type on the substrate, wherein a catalytic layer is provided as at least part of the first sensor;
   a second sensor of the first type on the substrate and adjacent to the first sensor; and
   a lid over the substrate, wherein an opening through the lid is provided over the first sensor and the second sensor, and wherein the catalytic layer of the first sensor is facing toward the opening in the lid.

2. The sensor device of claim 1, wherein the first type of sensor is a temperature sensor.

3. The sensor device of claim 2, wherein the temperature sensor is a thermocouple or a thermopile.

4. The sensor device of claim 2, wherein the first type of sensor uses a change in resistance to measure temperature.

5. The sensor of claim 4, wherein the first type of sensor is part of a Wheatstone bridge with two resistors for the first sensor, wherein the two resistors for the first sensor comprise the catalytic layer, and wherein two resistors are provided for the second sensor.

6. The sensor of claim 2, wherein the first type of sensor is a resonator.

7. The sensor of claim 6, wherein the resonator is a surface acoustic wave (SAW) resonator or a bulk acoustic wave (BAW) resonator.

8. The sensor of claim 1, wherein the catalytic layer comprises platinum, copper, gold, or silver.

9. The sensor of claim 1, further comprising:
   electronics on the substrate to enable data storage, signal processing, and/or wired/wireless I/O.

10. The sensor of claim 1, further comprising:
    a third sensor of the first type on the substrate, wherein a catalytic layer is provided as at least part of the third sensor, wherein the catalytic layer of the third sensor is different than the catalytic layer of the first sensor; and
    a fourth sensor of the first type on the substrate and adjacent to the third sensor, wherein the third sensor and the fourth sensor are raised up from the substrate higher than the first sensor and the second sensor.

11. A sensor device, comprising:
    a substrate;
    a first sensor of a first type on the substrate, wherein a catalytic layer is provided as at least part of the first sensor;
    a second sensor of the first type on the substrate and adjacent to the first sensor;
    a lid over the substrate, wherein an opening through the lid is provided over the first sensor and the second sensor;
    a third sensor of the first type on the substrate, wherein a catalytic layer is provided as at least part of the third sensor, wherein the catalytic layer of the third sensor is different than the catalytic layer of the first sensor; and
    a fourth sensor of the first type on the substrate and adjacent to the third sensor, wherein the third sensor and the fourth sensor are raised up from the substrate higher than the first sensor and the second sensor.

12. The sensor device of claim 11, wherein the first type of sensor is a temperature sensor.

13. The sensor device of claim 12, wherein the temperature sensor is a thermocouple or a thermopile.

14. The sensor device of claim 12, wherein the first type of sensor uses a change in resistance to measure temperature.

15. The sensor of claim 14, wherein the first type of sensor is part of a Wheatstone bridge with two resistors for the first sensor, wherein the two resistors for the first sensor comprise the catalytic layer, and wherein two resistors are provided for the second sensor.

16. The sensor of claim 12, wherein the first type of sensor is a resonator.

17. The sensor of claim 16, wherein the resonator is a surface acoustic wave (SAW) resonator or a bulk acoustic wave (BAW) resonator.

18. The sensor of claim 11, wherein the catalytic layer comprises platinum, copper, gold, or silver.

19. The sensor of claim 11, further comprising:
   electronics on the substrate to enable data storage, signal processing, and/or wired/wireless I/O.

* * * * *